United States Patent [19]

Watanabe

[11] Patent Number: 5,262,736
[45] Date of Patent: Nov. 16, 1993

[54] COMPACT VOLTAGE CONTROLLED MICROWAVE OSCILLATOR WITH DIELECTRIC RESONATOR

[75] Inventor: Hideaki Watanabe, Fukushima, Japan

[73] Assignee: NEC Corporation, Japan

[21] Appl. No.: 855,899

[22] Filed: Mar. 23, 1992

[30] Foreign Application Priority Data

Mar. 23, 1991 [JP] Japan ............................. 3-083450

[51] Int. Cl.[5] .................................................. H03B 5/18
[52] U.S. Cl. ....................................... 331/68; 331/99; 331/107 SL; 331/117 D
[58] Field of Search ............... 331/68, 96, 99, 107 SL, 331/107 DP, 117 D

[56] References Cited

U.S. PATENT DOCUMENTS

| | | | |
|---|---|---|---|
| 4,609,883 | 9/1986 | Mizumura et al. | 331/117 D X |
| 4,628,283 | 12/1986 | Reynolds | 331/117 D X |
| 4,871,983 | 10/1989 | Graycar | 331/96 |
| 4,922,211 | 5/1990 | Otremba et al. | 331/96 X |

FOREIGN PATENT DOCUMENTS 296009 12/1988 European Pat. Off. .
60-79806 7/1985 Japan .

Primary Examiner—Siegfried H. Grimm
Attorney, Agent, or Firm—Ostrolenk, Faber, Gerb & Soffen

[57] ABSTRACT

In a voltage controlled oscillator, a dielectric resonator is mounted on a base of a conductive housing, and a dielectric substrate is secured to sidewalls of the housing in a position spaced from the dielectric resonator. A first stripline is secured to one surface of the substrate and electromagnetically coupled to the dielectric resonator, and an oscillating element is electrically connected to the first stripline. A second stripline is secured to the opposite surface of the substrate and capacitively coupled to the first stripline through the substrate. The second stripline is adapted to receive a frequency control voltage from an external circuit. A voltage-controlled variable capacitance element is secured to the substrate and electrically connected to the second stripline.

4 Claims, 2 Drawing Sheets

COMPACT VOLTAGE CONTROLLED MICROWAVE OSCILLATOR WITH DIELECTRIC RESONATOR

BACKGROUND OF THE INVENTION

The present invention relates to a voltage controlled oscillator for use in the microwave region.

A conventional voltage controlled oscillator for use in the microwave region includes first and second striplines secured to the base of a conductive housing, and a dielectric resonator located between the striplines to establish electromagnetic coupling between each stripline and the resonator. A varactor diode is electrically connected to one of the striplines and an oscillating element is connected to one end of the other stripline. By varying a voltage applied to the varactor diode, the oscillation frequency of the VCO is controlled.

Because of the side-by-side arrangement of striplines with respect to the resonator, the overall size of the VCO is large, and implementation of a compact voltage controlled oscillator has been desired.

SUMMARY OF THE INVENTION

It is therefore an object of the present invention to provide a compact voltage controlled oscillator.

According to the present invention, there is provided a voltage controlled oscillator comprising a dielectric resonator and a dielectric substrate spaced from the dielectric resonator. The substrate has a first surface facing the dielectric resonator and a second surface opposite to the first surface. A first stripline is secured to the first surface of the substrate and electromagnetically coupled to the dielectric resonator, and an oscillating element is electrically connected to the first stripline. A second stripline is secured to the second surface of the substrate and capacitively coupled to the first stripline through the substrate. The second stripline is adapted to receive a frequency control voltage from an external circuit. A voltage-controlled variable capacitance element is secured to the substrate and electrically connected to the second stripline.

The stacked arrangement of the first and second striplines in relation to the dielectric resonator makes possible the reduction of the voltage controlled oscillator to one half the size of the prior art VCO.

BRIEF DESCRIPTION OF THE DRAWINGS

The present invention will be described in further detail with reference to the accompanying drawings, in which.

DETAILED DESCRIPTION

Figure 1:
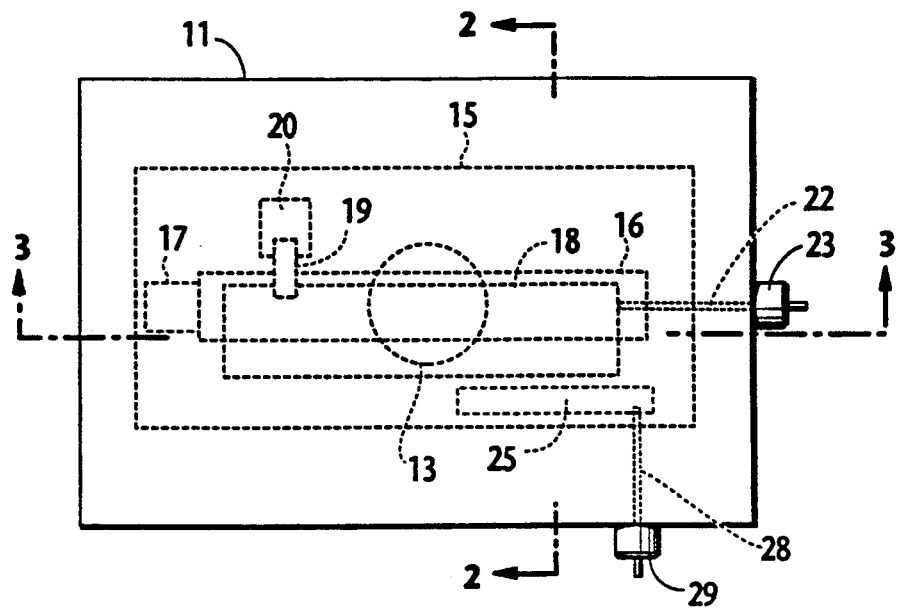
FIG. 1 is a plan view of a voltage controlled oscillator of the present invention.
Figure 2:
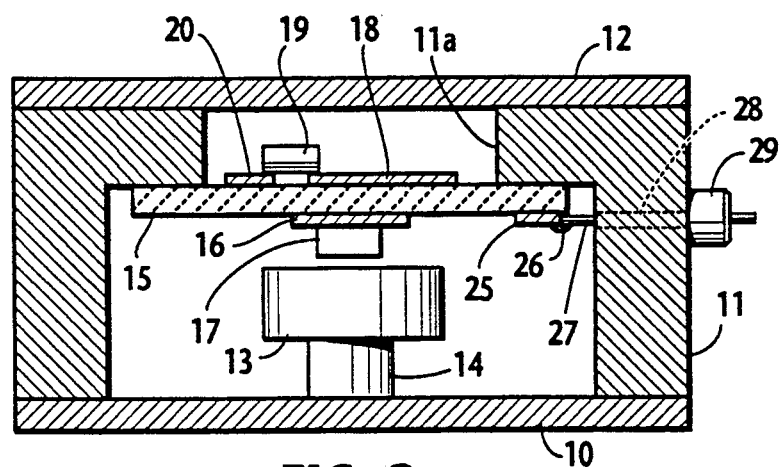
FIG. 2 is a cross-sectional view taken along the lines 2—2 of FIG. 1.
Figure 3:
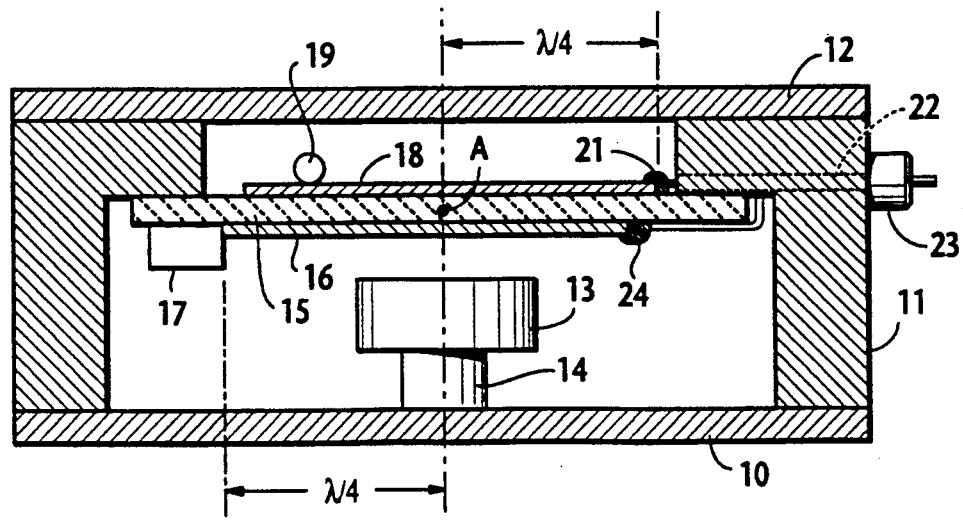
FIG. 3 is a cross-sectional view taken along the lines 3—3 of FIG. 1.

Referring to FIGS. 1 to 3, there is shown a voltage controlled oscillator according to the present invention. The oscillator comprises a conductive housing formed by a base member 10, a side-wall portion 11 and a top plate 12. A dielectric resonator 13 of cylindrical structure is supported from the base member 10 by means of a cylindrical conductive support member 14. A rectangular substrate 15 of dielectric material is secured to an inwardly extending upper portion 11a of side-wall 11 in a position spaced from the upper surface of the dielectric resonator 13. To the lower surface of substrate 15 is secured a first stripline 16 which extends along the length of the substrate 15 and is electromagnetically coupled with the dielectric resonator 16 to form part of an oscillating circuit. An oscillating element 17 is secured to the substrate 15. The oscillating element 17 has two dc supply terminals, one of which is connected to the left end of stripline 16 which is spaced a distance $\lambda/4$ from a point A aligned with the center axis of dielectric resonator 13, where $\lambda$ is the wavelength of oscillations generated by the oscillating element when no frequency control voltage is supplied to the voltage-controlled oscillator. The right end of stripline 16 terminates at an arbitrary point.

On the upper surface of substrate 15 is a second stripline 18 which is capacitively coupled to the first stripline 16 by substrate 15. The second stripline 18 extends along the length of substrate 15, with the right end thereof being terminated at a point spaced a distance of $\lambda/4$ from the point A and the left end being terminated at an arbitrary point. The right end of stripline 18 is soldered as at 21 to an insulated conductor which extends through a hole 22 to a terminal 23. A pair of dc supply conductors also extends through hole 22 from terminal 23, one of the dc supply conductors being soldered to the right end of stripline 16 as shown at 24 and the other dc supply conductor extending alongside of stripline 16 to the other dc supply terminal of oscillating element 17.

A voltage-controlled variable capacitance element, such as varactor diode 19 is secured on the substrate 15 and is electrically connected at one terminal thereof to the second stripline 18, the other terminal of the diode being coupled to a conductive strip 20 which is coupled to the housing. Microwave energy is extracted by means of a stripline 25 which is secured to the underside of dielectric substrate 15 and runs parallel to stripline 16 so that stripline is electromagnetically coupled with dielectric resonator 13 and stripline 16. Stripline 25 is soldered at 26 to a conductor 27 which extends through a hole 28 to a terminal 29 from which microwave energy is withdrawn to an external utilization circuit, not shown.

Figure 4:
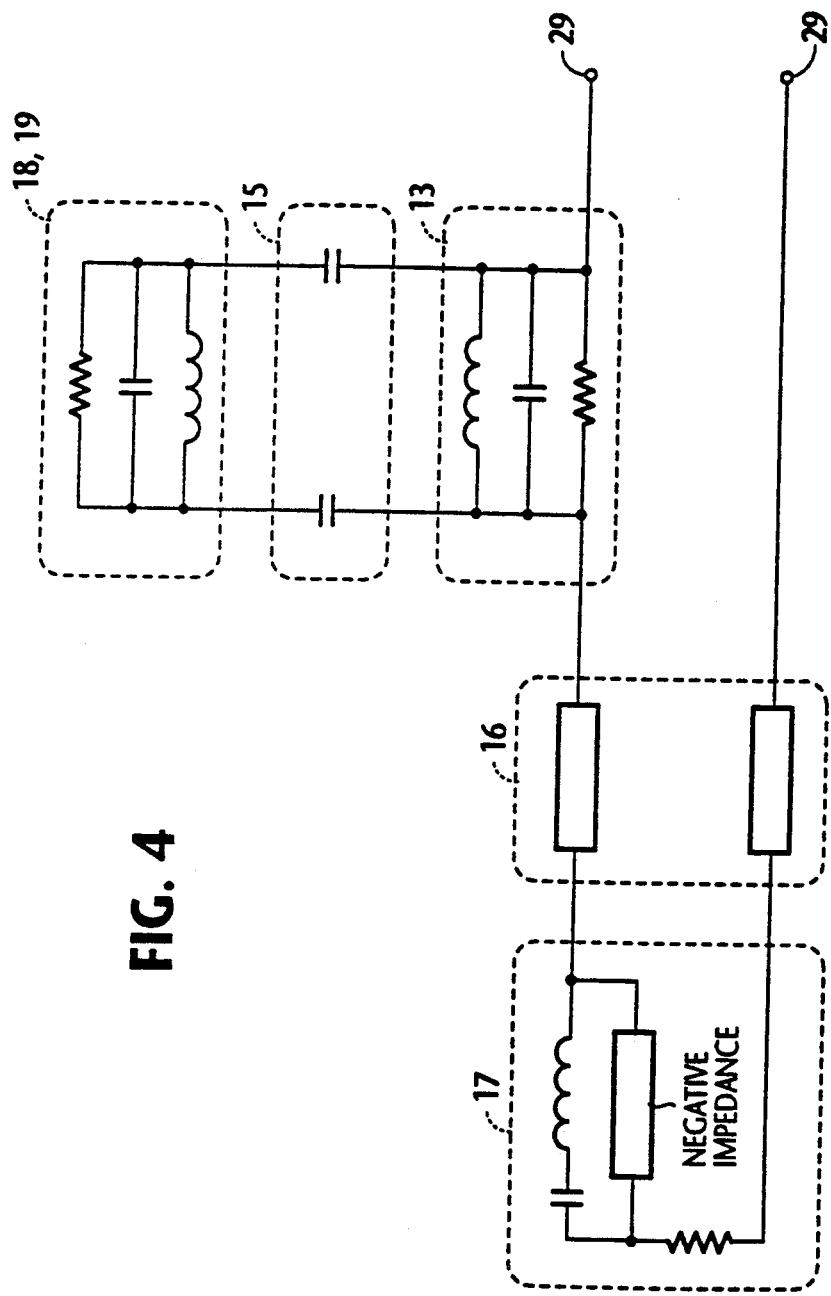
FIG. 4 is a circuit diagram showing an equivalent circuit of the voltage controlled oscillator of this invention.

In an equivalent circuit of the voltage controlled oscillator of this invention, shown in FIG. 4, oscillating element 17 has two equivalent output terminals, one of which is connected through a first half section of stripline 16 and through the dielectric resonator 13 to a first output port 30. The the other output terminal of oscillating element 17 is connected through a second half section of stripline 16 to a second output port 31. An external load is coupled between output terminals 29. As illustrated, the upper stripline 18 and varactor diode 19 constitute an LCR circuit which is capacitively coupled by dielectric substrate 15 to dielectric resonator 13, so that a variation of the capacitance value of varactor 19 caused the total capacitance of the voltage controlled oscillator to vary accordingly to alter the output frequency.

By the stacked arrangement of the present invention, the total volume of the voltage controlled oscillator is substantially reduced to one half of the prior art VCO. Since the upper stripline 18 is capacitively coupled with the lower stripline 16 which is strongly coupled electromagnetically with dielectric resonator 13, the output frequency of the device can be controlled with a lower control voltage than in the case of the prior art.

Experiments showed that the output frequency of the voltage-controlled oscillator linearly changed with a rate of 7 MHz per volt and the variation of the output power was within 3 dB when the control voltage is at 15 volts.

What is claimed is:

1. A voltage controlled oscillator comprising:
    a dielectric resonator;
    a dielectric substrate spaced from said dielectric resonator and having a first surface facing said dielectric resonator and a second surface opposite to said first surface;
    a first stripline secured to the first surface of said substrate and electromagnetically coupled to said dielectric resonator;
    an oscillating element electrically connected to said first stripline;
    a second stripline secured to the second surface of said substrate and capacitively coupled to said first stripline through the substrate, said second stripline being adapted to receive a frequency control voltage from an external circuit; and
    a voltage-controlled variable capacitance element secured to said substrate and electrically connected to said second stripline.

2. A voltage controlled oscillator as claimed in claim 1, further comprising a third stripline secured to the first surface of said substrate and running parallel to said first stripline so that the third stripline is electromagnetically coupled with said first stripline and said dielectric resonator, and terminal means coupled to said third stripline for withdrawing high frequency energy therefrom.

3. A voltage controlled oscillator comprising:
    a conductive housing having a base plate, a side wall portion and a top plate;
    a cylindrical dielectric resonator;
    a conductive support on said base plate for supporting said cylindrical dielectric resonator at a distance from said base plate;
    a substrate of dielectric material secured to said side wall portion of the housing so that the substrate is spaced from said dielectric resonator, said substrate having a first surface facing said dielectric resonator and a second surface opposite to said first surface;
    a first stripline secured to the first surface of said substrate and electromagnetically coupled to said dielectric resonator, said first stripline having a portion extending from a first point aligned with a center axis of said dielectric resonator to a second point spaced a distance $\lambda/4$ from said first point;
    an oscillating element secured to said substrate and electrically connected to the second point of said first stripline;
    a second stripline secured to the second surface of said substrate and capacitively coupled to said first stripline, and being adapted to receive a frequency control signal from an external circuit, said second stripline having a portion extending from a third point aligned with the center axis of said dielectric resonator to a fourth point spaced a distance $\lambda/4$ from said third point; and
    a voltage-controlled variable capacitance element secured on said substrate, the variable capacitance element being electrically connected at one terminal thereof to said second stripline and electrically connected at the other terminal thereof to said housing, where $\lambda$ is the wavelength of oscillations generated by said oscillating element in the absence of said frequency control voltage.

4. A voltage controlled oscillator as claimed in claim 3, further comprising a third stripline secured to the first surface of said substrate and running parallel to said first stripline so that the third stripline is electromagnetically coupled with said first stripline and said dielectric resonator, and terminal means coupled to said third stripline and said conductive housing.

* * * * *